United States Patent
Lasseuguette et al.

(10) Patent No.: US 7,545,686 B2
(45) Date of Patent: Jun. 9, 2009

(54) DEVICE FOR SETTING UP A WRITE CURRENT IN AN MRAM TYPE MEMORY AND MEMORY COMPRISING

(75) Inventors: Jean Lasseuguette, Grenoble (FR); Cyrille Dray, Eybens (FR); Sébastien Barasinski, Meylan (FR)

(73) Assignee: STMicroelectronics S.A., Montrouge (FR)

( * ) Notice: Subject to any disclaimer, the term of this patent is extended or adjusted under 35 U.S.C. 154(b) by 127 days.

(21) Appl. No.: 11/083,112

(22) Filed: Mar. 17, 2005

(65) Prior Publication Data

US 2006/0050585 A1 Mar. 9, 2006

(30) Foreign Application Priority Data

Mar. 18, 2004 (FR) .................... 04 02818

(51) Int. Cl.
*G11C 7/00* (2006.01)
*G11C 7/22* (2006.01)
(52) U.S. Cl. .................... 365/189.16; 365/158
(58) Field of Classification Search ............ 365/209, 365/189.09, 189.16, 157, 158
See application file for complete search history.

(56) References Cited

U.S. PATENT DOCUMENTS

| 4,442,398 | A | | 4/1984 | Bertails et al. |
| 5,631,600 | A | | 5/1997 | Akioka et al. |
| 5,892,356 | A | | 4/1999 | Chuang |
| 5,982,677 | A | * | 11/1999 | Fontana et al. ......... 365/189.09 |
| 6,957,158 | B1 | * | 10/2005 | Hancock et al. ............... 702/61 |
| 7,050,325 | B2 | * | 5/2006 | Iwata et al. ................. 365/158 |
| 2004/0001360 | A1 | * | 1/2004 | Subramanian et al. ...... 365/188 |

FOREIGN PATENT DOCUMENTS

WO    WO 03/067598 A2    8/2003

OTHER PUBLICATIONS

French Search Report from a corresponding French Application No. 04/02818, filed Mar. 18, 2004.

* cited by examiner

*Primary Examiner*—Huan Hoang
*Assistant Examiner*—Kretelia Graham
(74) *Attorney, Agent, or Firm*—Lisa K. Jorgenson; James H. Morris; Wold, Greenfield & Sacks, P.C.

(57) ABSTRACT

The invention relates to a device for setting up a write current on at least one write conducting line in an MRAM type integrated circuit memory, including a current mirror composed of a first stage acting as the reference regulated cascode stage receiving all or part of the write current on its input and a second stage acting as the copy regulated cascode stage copying the write current onto the write line.

12 Claims, 3 Drawing Sheets

DEVICE FOR SETTING UP A WRITE CURRENT IN AN MRAM TYPE MEMORY AND MEMORY COMPRISING

BACKGROUND OF INVENTION

1. Field of Invention

This invention relates to MRAM magnetic random access memories in general and is particularly applicable to a device for setting up a write current on at least one write conducting line in an MRAM type integrated circuit memory.

2. Discussion of Related Art

Magnetic random access memories (MRAM) are non-volatile type memories. Typically, a magnetic random access memory device comprises a matrix of memory cells arranged in rows and in columns, through which metallic tracks are routed. The metallic tracks extending along memory cell rows are called word lines and the metallic tracks extending along memory cell columns are called bit lines. Each memory cell thus located at the intersection of a word line and a bit line stores an information element in the form of a magnetization orientation.

Each memory cell is composed of two magnetic layers separated by a dielectric layer. Each magnetic layer has its own magnetization orientation. The magnetization orientation of one of the layers, called the free layer, can be modified, while the magnetization orientation of the other layer, called the fixed layer, is fixed in a particular orientation. The magnetization orientations of the two layers can be one of two situations: they are either parallel, in other words aligned along the same direction, or anti-parallel, in other words are aligned in opposite directions. These two orientations, parallel and anti-parallel, represent the logical values "1" and "0" respectively. As a variant, the parallel state may be interpreted as a logical "0" and the anti-parallel state may be interpreted as a logical "1".

Starting from this point, writing for such a memory cell consists of setting the magnetization orientation in the free layer as a function of the required logical state, either in a parallel state or in an anti-parallel state, with respect to the magnetization orientation of the fixed layer.

Typically, external magnetic fields are applied onto a selected cell to trigger the magnetization orientation in the free layer of this cell from one state to another. To achieve this, a write current is applied on the word line and on the bit line respectively intersecting at the location of the selected memory cell. The write currents are thus applied on the selected word line and bit line, creating magnetic fields which may combine at the intersection of the word line and the bit line to switch the magnetization orientation of the free layer of the selected memory cell from the parallel state to the anti-parallel state or vice versa, as a function of the data to be written in the cell.

High magnetic fields are necessary to change the state of a memory cell selected in write from one state to another, which requires that sufficiently high write currents of the order of ten milliamperes are circulated on the metallic tracks making up the word lines and bit lines at the intersection of which the memory cell selected in write is located. Consequently, it is necessary to be able to control the value of the intensity of the write current circulating on the metallic tracks with high precision, and also the rate at which rising and falling fronts of the write current intensity are set up.

Some constraints must be considered during the phases of setting up and stopping the current pulse necessary to change the magnetization of an MRAM memory cell for programming the cell. Thus, if the gradient of the current pulse is too high during the setting up phase, in other words if the current level necessary to program a cell is set up too suddenly, oscillation phenomena may occur consequently inducing a high instability in the magnetization orientation of the memory cell selected in write. Therefore the rate at which the write current is set up has to be relatively low to avoid this problem. However, the duration of the write cycle will be longer if the current set up speed is lower. As a result, a compromise has to be found in the gradient of the write current pulse, so as to avoid oscillation phenomena while not penalizing the duration of the write cycle, which is an important parameter for memories in general.

Figure 1:
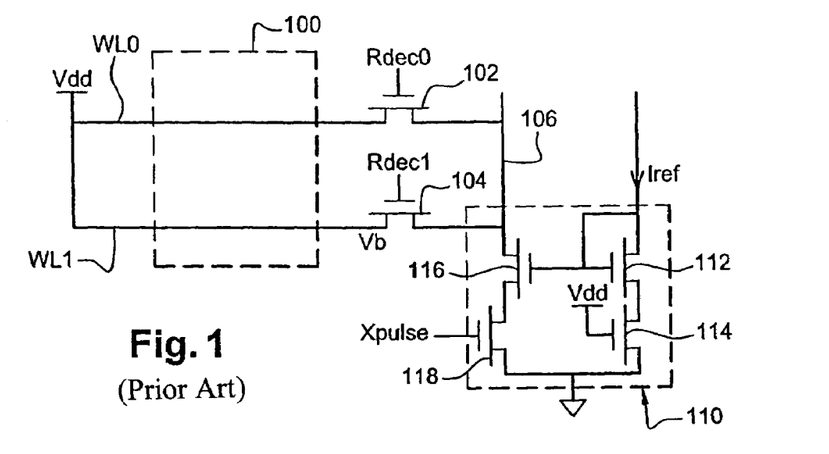
FIG. 1 shows a diagram illustrating a solution according to prior art for setting up a write current on a write line in a matrix of MRAM memory cells and has already been described.

U.S. Pat. No. 6,657,889 in the name of the Motorola Company describes an MRAM type memory device in which the write circuitry is based on a sequence of several current mirror stages and which includes means of checking the write current set up gradient. FIG. 1 in the present application illustrates part of the write circuitry of the MRAM memory device according to U.S. Pat. No. 6,657,889, in a simplified manner.

A matrix of MRAM type memory cells is shown by the box reference 100 shown in dashed lines in FIG. 1. The matrix 100 includes a plurality of write bit lines and a plurality of write word lines, typically 128 or 256 lines, at the intersection of which memory cells are located, not shown in the Figure. Only two write word lines, WL0 and WL1, are shown in order to simplify the explanation. The associated write circuitry that will be described below is obviously located in a similar way on the bit lines of the memory cells matrix.

A power supply Vdd is connected to one end of each of the word lines WL0 and WL1. The other end of each of the write lines WLO and WL1 is connected to the drain of an NMOS transistor 102 and 104 respectively, dedicated to addressing of memory cells of the matrix. The transistor grid 102 is connected to a control signal Rdec0 output by an address decoder and its source is connected to a current mirror 110 through a conductor 106. The transistor grid 104 is connected to a control signal Rdec1 output by the address decoder and its source is connected to the current mirror 110 through the conductor 106. NMOS transistors 112, 114, 116 and 118 form the current mirror 110, which is provided with a reference current Iref having a value of several milliamperes. The branch composed of the transistors 116 and 118 of the current mirror stage 110 is made conducting during a write cycle when a synchronization signal Xpulse is activated on the grid of the transistor 118. The transistor 116 thus provides analog control of the current output by the current mirror 110, while the transistor 118 manages the duration of the write current pulse. Thus, when the write cycle relates to a memory cell in word line WL1, the transistor 104 is made conducting by activating the control signal Rdec1 and the copy current Iref is set up on word line WL1 once the Xpulse signal is activated. The pulse gradient of the write current is controlled by transistor junction capacitors precharged to a determined potential. An equivalent method is used for the bit line corresponding to the addressed cell.

The architecture proposed by U.S. Pat. No. 6,657,889 provides relatively good precision of the write current obtained by copy in the current mirror, however with a constraint to achieve this result. The transistor 116 must thus necessarily operate in the saturated zone. In this operating mode, the saturation current of a transistor is slightly dependent on the voltage on its drain. For operation of transistors in the saturated zone, the condition to be respected is that $Vds \geq Vgs - Vt$ (1), where Vds is the drain-source voltage of the transistor, Vgs is the grid-source voltage and Vt is the threshold voltage of the transistor.

The conducting tracks making up the word lines are inherently resistive. The fact of circulating a high current of the order of about ten milliamperes in word line WL1 will therefore inevitably cause a drop in the potential Vb at the end of the word line (by application of Ohm's law) and consequently a voltage drop at the drain of the MOS transistor 104, and transistor 116 of the current mirror. Therefore, the drain-source voltage of the transistors will drop, which could result in the transistors operating in their linear zone. In this case, it is no longer possible to guarantee that the current is copied with good precision at the word line WL1.

To maintain operation under saturation conditions despite the potential drop at the end of line WL1, U.S. Pat. No. 6,657,889, specifies that MOS transistors operating with a low grid-source voltage Vgs should be used, such that condition (1) is respected over the widest possible operating range. A MOS transistor that operates with a low grid-source voltage and that is nevertheless designed to carry a high current, must be large in size, typically on the order of 1 mm wide. Thus, the precision of the current copy which in this solution according to prior art is directly related to a saturated mode operating condition of the transistors, is obtained at the detriment of the size of the transistors forming the current mirror, which can reduce the memory integration density.

However, if the potential drop at the end of the line is such that Vb<1 V, it becomes very difficult to keep transistors operating under saturated conditions when current is passing, even if they are large. Therefore a high end of line voltage has to be maintained, at least Vb>1 V, to be able to hope that the assembly can be operated with the required precision.

SUMMARY OF THE INVENTION

An object of the present invention is to overcome the disadvantages of the prior art by proposing a device for setting up a write current on write lines of an MRAM type memory plane, that guarantees very good precision in copying the write current output with a reduced voltage necessary for correct operation at the end of the line.

Another object of the present invention is to provide a device for setting up a write current on not less than one write conducting line of an MRAM type integrated circuit memory, comprising a current mirror composed of a first stage acting as the reference regulated cascode stage receiving all or part of the write current on its input and a second stage acting as the copy regulated cascode stage copying the write current onto the write line.

Preferably, the device according to the invention is used to set up a write current on a plurality of write lines, each line being connected to the drain of a corresponding MOS transistor of the copy regulated cascode stage, the said MOS transistor addressing the write line with which it is associated among the said plurality of lines.

In this configuration according to the invention, each addressing MOS transistor is connected through its source to the drain of a common MOS transistor of the copy regulated cascode stage, designed to fix the value of the write current and for which the grid is connected to the output of the reference regulated cascode stage.

According to one preferred embodiment of the invention, the copy regulated cascode stage includes a slaving branch composed of a MOS transistor the grid voltage on which depends on a current output by a current source to which it is connected through its drain, the drain of the common MOS transistor fixing the write current is connected to the grid of the said MOS transistor of the slaving branch through a voltage follower stage outputting a determined voltage increment to the fixed grid voltage of the said MOS transistor of the said slaving branch.

Advantageously, for each write line considered, the grid of the associated addressing MOS transistor is connected to a transfer gate with two states that depend on an addressing signal that is applied to it, a first state in which the said grid is connected to the ground and a second state in which the said grid is connected to the MOS transistor drain of the slaving branch of the copy regulated cascode stage, so that the write current fixed by the common transistor can pass through the said addressing MOS transistor on the said line.

According to one particular embodiment, the copy regulated cascode stage includes means for controlling the set up gradient of the write current.

According to this particular embodiment, the control means of the write current set up gradient includes at least one capacitor, connected to the drain of the MOS transistor of the slaving branch of the copy regulated cascode stage through a corresponding transfer gate, the said gate being designed to be activated when no line is addressed in write, so that the equivalent capacitance at the MOS transistor drain of the said slaving branch can be varied.

According to one embodiment, the current source of the copy regulated cascode stage slaving branch includes a PMOS transistor for which the grid is connected to a polarization voltage, the source is connected to a power supply voltage and the drain is connected to the drain of the other MOS transistor of the slaving branch, the said transistors of the slaving branch operating under saturation conditions.

According to one embodiment, the voltage follower stage comprises a first PMOS transistor, the source of which is connected to a power supply voltage, the grid is connected to a polarization voltage and the drain is connected to the source of a second PMOS transistor for which the drain is connected to the ground, the said source of the said second PMOS transistor being connected to the grid of the MOS transistor of the slaving branch and the grid of the said second PMOS transistor of the said voltage follower stage being connected to the drain of the common MOS transistor designed to fix the value of the write current, the said second PMOS transistor of the said voltage follower stage being designed to apply a voltage received on its grid to its source, adding the voltage increment to it.

The invention also relates to an MRAM type memory, comprising at least one device for setting up a write current like that defined above.

A memory according to the invention organized as a matrix into write bit lines and write word lines comprises a device for setting up a write current for all write bit lines and for all write word lines respectively.

The invention finally relates to an integrated circuit including a device for setting up a write current or a memory, as they have been defined according to the invention.

BRIEF DESCRIPTION OF THE DRAWINGS

Other characteristics and advantages of this invention will appear more clearly after reading the following description given for illustration purposes and not limitatively, and with reference to the attached Figures in which.

DETAILED DESCRIPTION

Figure 2:
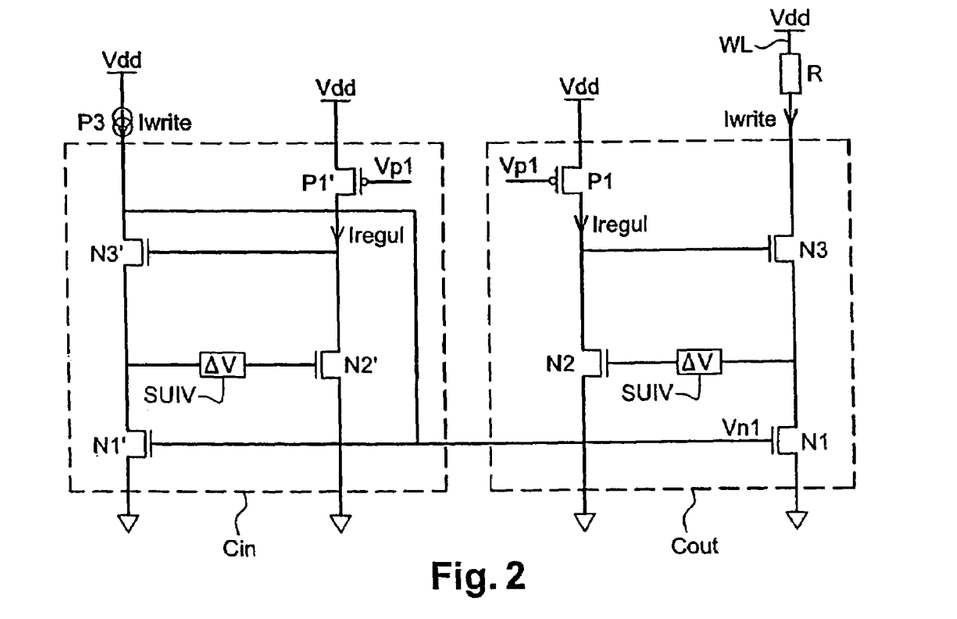
FIG. 2 is a diagram illustrating the device for setting up a write current according to the invention, represented for a single write line without the addressing functions.

Thus, with reference to FIG. 2, a write line WL of an MRAM type memory is shown diagrammatically by its equivalent resistive load R connected through a first end to a power supply voltage Vdd. This load may represent a row or a column of the MRAM memory matrix.

The device for setting up a write current on the write line WL includes two regulated cascode type stages configured in current mirror to set up a write current Iwrite on the write line WL. Thus, the device according to the invention includes a current mirror formed of a first regulated cascode stage Cin called the reference stage, receiving the write current Iwrite to be applied to the write line WL on its input, and a second regulated cascode stage Cout as its mirror, and copying the current Iwrite on the write line.

The Cout stage comprises a first slaving branch comprising a current source outputting a current Iregul. The current source Iregul includes a PMOS transistor P1 with its grid connected to a polarization voltage Vpl generated by a circuit not shown in the Figure, and for which the source is connected to a power supply voltage Vdd. The drain of transistor P1 is connected to the drain of an NMOS transistor N2, the source of which is connected to the ground. Transistors P1 and N2 are designed to operate in saturated mode. In this way, the transistor N2 is polarized by a constant current on its drain, so as to slave its grid voltage by circulation of the current Iregul. When the MOS N2 is in the saturated zone, for a given grid—source voltage Vgs, the transistor always circulate the same current regardless of the voltage on its drain. Therefore, the current Iregul in N2 will be forced such that the voltage Vgs of N2 is set up enabling it to operate in the saturated zone. Thus, as long as N2 is in the saturated zone, its voltage Vgs is fixed by the current Iregul output by P1. The voltage Vgs of N2 also depends on its size W/L width of a transistor/length of a transistor).

The Cout stage includes a second branch comprising an NMOS transistor N1 for which the grid voltage Vn1 is generated at the output from the regulated cascode stage Cin and, according to a first embodiment, the drain of which is connected directly to the grid of the transistor N2 in the first branch. Therefore the drain voltage of N1 is slaved by the grid voltage of transistor N2 in the first branch. The main specific function of transistor N1 is to fix the write current required to circulate in the load R. The transistor N1 is also connected through its drain to the source of an NMOS transistor N3, the drain of which is connected to the second end of the write line WL and the grid of which is connected directly to the drain of transistors P1 and N2, as in the first embodiment. The set of corresponding connections between the drain of N1 and the grid of N2, the drain of N2 and the grid of N3 and the source of N3 and the drain of N1, forms the counter reaction loop of the regulated cascode stage Cout, the transistors N2 and N3 forming part of the loop.

The transistor N3 is more particularly dedicated to addressing of the write line WL in combination with another addressing element not shown in this Figure and that will be described with reference to FIG. 4. The transistor N3 also performs a voltage regulation function by absorbing the voltage drop at the terminals of the load R due to passage of the write current, thus maintaining a constant voltage on its source.

Since the voltage on the drain of transistor N1 is fixed by the transistor N2, the value of the current circulating in transistor N3 is fixed by the transistor N1. Since the transistor N2 also has a constant grid voltage and is operating in the saturated zone, the voltage on its drain only has a very small impact on the polarization of the slaving branch and this voltage corresponding to the grid voltage of N3 will be set up such that the grid-source voltage Vgs of the transistor N3 is set up to circulate the current fixed by N1.

Advantageously, due to the particular configuration of the regulated cascode stage, the result is decorrelation of the addressing function of the write line and the dynamic control function of the write current during a procedure to set up the write current Iwrite on the write line WL.

The Cout stage copying the current Iwrite on the write line WL is the mirror of the regulated cascode stage Cin. Therefore, the structure of the slaving branch is exactly at the level of the reference stage Cin with transistors P1' and N2' configured in the same way as the transistors P1 and N2 in the Cout stage. Transistors P1', N2' and P1, N2 in each stage are sized identically and the same current Iregul circulates in the slaving branch of each of the stages.

The stage Cin also includes a second branch, on which the write current Iwrite to be copied onto the write line WL will be received on its input. The current Iwrite is output by a current source P3 connected to the drain of an NMOS transistor N3' of the second branch of the stage Cin. The source of N3' is connected to the drain of an NMOS transistor N1', the source of which is connected to the ground. The transistor N3' is also connected through its drain to the grid of transistor N1'. The drain of transistor N1' is connected to the grid of transistor N2 of the slaving branch and the grid of transistor N3' is connected to the drain of transistors P1' and N2' in the slaving branch, all of these connections forming the counter reaction loop of the regulated cascode stage Cin. Finally, the grid of the transistor N1' is connected directly to the grid of transistor N1 of the Cout stage. The voltage Vn1 polarizing the grid of transistor N1 of the regulated cascode stage Cout is thus generated by the grid voltage of transistor N1'.

In the example in FIG. 2, the current source P3 generates the current Iwrite that is determined to circulate in the write line WL. In this case, the transistors N1 and N3, and N1' and N3', are sized in the same manner. Preferably, for cost reasons, considering that the write current involved Iwrite is fairly high, of the order of about ten milliamperes, it is intended that only part of the write current Iwrite actually required in the write line WL should be circulated through the NMOS transistors N3' and N1', for example a current equal to $1/16^{th}$ of the write current Iwrite. The current source P3 then outputs a current equal to a value corresponding to Iwrite/16 that circulates in transistors N3' and N1', the size of which is 16 times smaller than the size of the corresponding transistors N3 and N1 in the Cout stage. In this manner, the copy procedure through the mirror results in a current Iwrite circulating in the write line WL.

According to another preferred embodiment of the invention, a voltage follower stage SUIV is integrated in the counter reaction loop of each of the regulated cascode stages Cin, Cout of the current mirror and more particularly between the drain of transistor N1/N1' and the grid of transistor N2/N2'. Thus, in this preferred embodiment, with reference to the mirror stage Cout copying the write current Iwrite on the write line, the drain of transistor N1 fixing the write current is connected to the grid of the MOS transistor N2 of the slaving branch through a voltage follower stage SUIV, designed to output a determined voltage increment ΔV to the grid voltage of transistor N2.

For smooth operation of the assembly, it is essential that the transistor N2 should operate in the saturated zone, such that its grid voltage remains fixed by the current Iregul independently of the voltage on its drain, since this voltage will vary as a function of the adjustment that takes place on the grid voltage of N3, as explained above. One of the conditions to be respected with the transistor N2 to achieve this is that its grid-source voltage Vgs should be greater than its threshold voltage Vt. Thus, the voltage follower SUIV advantageously enables operation with a low drain voltage to activate the transistor N1, while assuring that the grid voltage on N2 is greater than the threshold voltage Vt of N2. Due to the voltage follower SUIV in the counter reaction loop, the grid of N2 is polarized at the drain voltage of N1, this voltage being deliberately made low, increased by the voltage increment ΔV, the voltage increment ΔV being selected to be greater than Vt of N2 so as to achieve the required operation for N2 above its threshold and under saturation conditions.

Furthermore, due to the voltage follower stage SUIV that makes the transistor N1 operate with a lower drain voltage, the available voltage at the equivalent resistive load R of the write line is correspondingly greater. By ensuring that there is a particular voltage level available at the terminals of the load R, correct operation of the current copy is guaranteed even when the load becomes very high.

Typically, the system according to the invention can operate correctly by providing good precision of the copy of the write current circulating in the write line with a relatively low voltage of the order of 600 millivolts at the end of the write line, the resulting low drain voltage on N1 then being compensated at the grid of N2 by the voltage follower stage SUIV, that assures operation for N2 beyond its threshold voltage which is of the order of 700 millivolts. The current copy quality is particularly due to the fact that the transistors P1 and N2, and P1' and N2' that form the slaving branch, and the voltage follower stage SUIV are identical elements configured in the same way in each of the regulated cascode stages Cin and Cout, which means that constant and identical polarizations can be imposed on transistors N1' and N1 that fix the write current.

Figure 3:
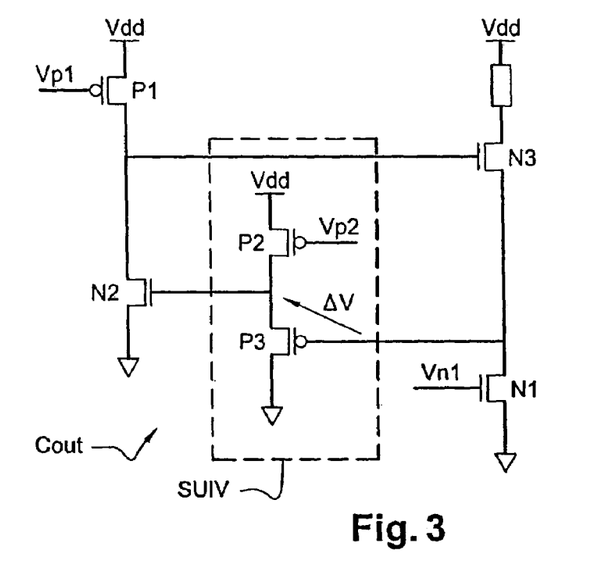
FIG. 3 is a diagram of the copy regulated cascode stage in FIG. 2, in which a preferred embodiment is illustrated for producing the voltage follower stage.

FIG. 3 is a diagram of a copy regulated cascode stage Cout in FIG. 2, which illustrates a preferred embodiment of the invention for implementation of the voltage follower stage SUIV at the counter reaction loop. According to this embodiment, the voltage follower stage SUIV comprises a first PMOS transistor P2 for which the source is connected to the power supply voltage Vdd, the grid of which is connected to a polarization voltage Vp2 generated by a circuit not shown in the Figure, and the drain of which is connected to the source of a second PMOS transistor P3, for which the drain is connected to the ground. The source of the second PMOS transistor P3 of the follower stage is connected to the grid of the transistor N2 of the slaving branch and its grid is connected to the drain of the transistor N1 designed to fix the value of the write current. The transistor P3 of the voltage follower stage SUIV is thus designed to apply the voltage received on its grid to its source, adding voltage increment ΔV. In this way, the grid of N2 receives the drain voltage of N1 increased by ΔV.

In this configuration, ΔV corresponds to the threshold voltage Vt of P3, plus a component dependent on the current output by P2.

Another advantage due to the presence of the voltage follower stage SUIV in the counter reaction loop relates to the reduction of the size of transistor N2.

Due to the fact that N2 is designed to operate with a grid voltage close to its threshold voltage and that it must be capable of carrying the current output by P1, it is necessary to make a transistor N2 having a very large dimensioning, defined by its W/L ratio. In small signals analysis, N2 can be considered as being a class A amplifier with its input signal on its grid, its output signal on its drain and a constant current polarization on its drain. In this configuration, its voltage gain is given partly by its transductance gm. The value gm depends directly and linearly on the size of the transistor, which means that the gain is greater as the transistor becomes larger. Thus the disadvantage of the large size of N2 results in the gain of the counter reaction loop being too large, causing instability of the system under transient conditions for setting up the write current at the required value once the write line has been selected. In particular, this instability introduces overshoot problems (current peak greater than the set value).

The presence of the voltage follower stage in the counter reaction loop advantageously significantly reduces the size of transistor N2 and therefore eliminates the disadvantages mentioned above, by enabling more direct and better controlled setting of the current to the required write value under transient conditions. Transistor P3 of the follower stage is in a follower source configuration with its input signal on its grid and its output signal on its source. In this configuration, the small signals analysis of the transistor shows that its voltage gain is slightly less than 1 (about 0.8). The same is true for transistor N3 of the loop that is also in a follower source configuration. Thus, the total gain of the counter reaction loop comprising of multiplication of gains of the different elements of the loop, is given by N2, P3 and N3, although N3 is only involved very slightly.

The device for setting up a write current in an MRAM like that described above in FIGS. 2 and 3 is a simplified representation of the device according to the invention, since this was described with reference to a single write line and therefore without the addressing function. An MRAM memory is conventionally organized as a matrix with a plurality of write bit lines and a plurality of write word lines, at the intersection of which the MRAM memory cells are located. Therefore the device according to the invention is used to set up a write current on a plurality of write bit or write word lines of an MRAM memory. This type of configuration is described with reference to FIG. 4 illustrating n write word lines of the device according to the invention being put in common, with addressing functions of these lines represented, for example where n is equal to 128 or 256. Each write line WL0, WLn−1 is represented by its equivalent resistive load, R0, . . . , Rn−1 respectively.

Thus, the MOS transistor N3 in the second branch of the regulated cascode stage Cout is separated into one transistor for each write line. Therefore, each line is connected to the drain of a corresponding MOS transistor N3 in the Cout regulated cascode stage, each MOS transistor N3 addressing the write line with which it is associated among the n lines, in write. The MOS transistor N1 fixing the value of the write current, and the remaining part of the structure of the regulated cascode stage Cout, are common to the n write lines. Therefore each addressing MOS transistor N3 associated with each of the n write lines is connected through its source to the drain of the common transistor N1 of the Cout stage.

More precisely, concerning addressing of one line among the plurality of write lines, the grid of each addressing transistor N3 associated with a given write line is connected to a transfer gate, T0, . . . , Tn−1, respectively, with two states that depend on an addressing signal that is applied to it and that may be one of the two values adrb and adr, corresponding to a first state in which the grid of transistor N3 is connected to the ground as long as the associated line is not addressed, and a second state in which the grid of N3 is connected to a node common to all transfer gates, namely the drain of transistor N2 when the associated line is addressed, thus enabling a write current fixed by the common transistor N1 to pass through the transistor N3 on the associated write line.

Therefore, as long as a write line has not been addressed, the grid of the associated transistor N3 is kept equal to zero. To achieve this, for each write line, an NMOS transistor N4 is provided, the drain of which is connected to the grid of the associated transistor N3 and the source of which is connected to the ground. When a line considered is not addressed, the transistor N4 is made active by receiving the adrb signal on its grid, thus connecting the grid of transistor N3 to the ground.

Figure 4:
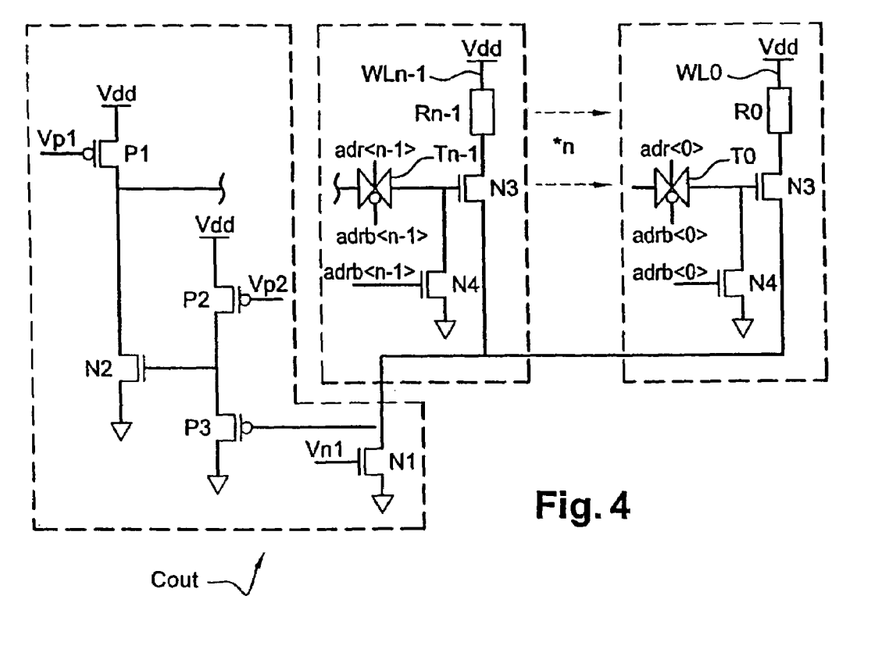
FIG. 4 is a diagram illustrating putting n write lines of the device according to the invention in common, with the addressing functions of these represented lines.
Figure 5:
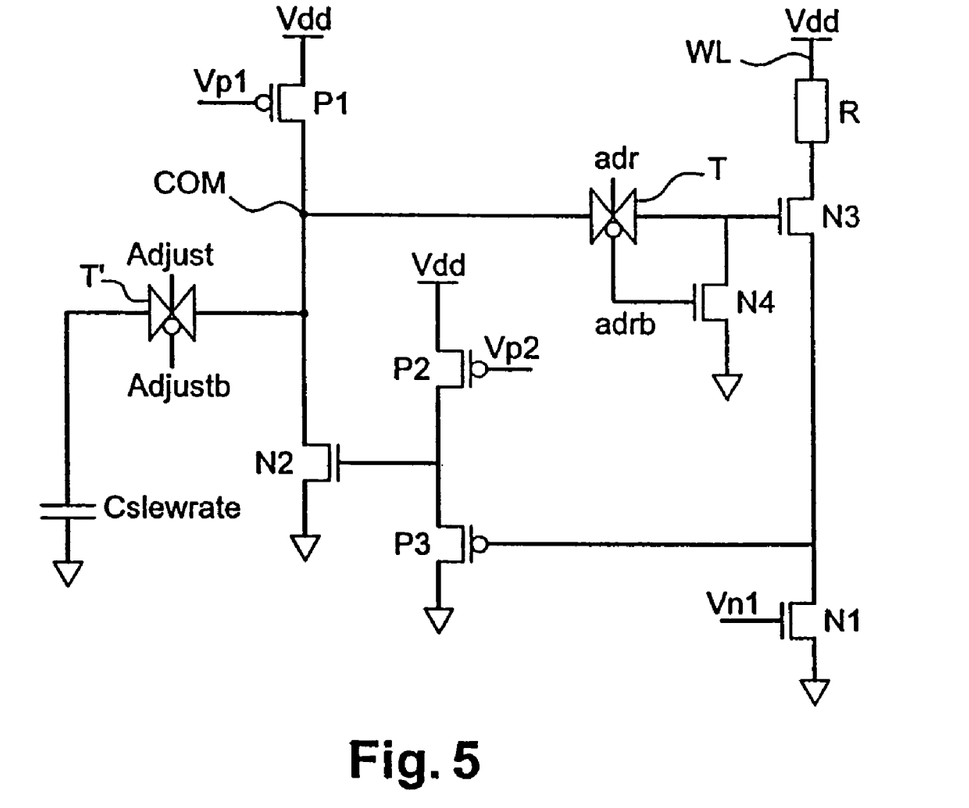
FIG. 5 illustrates a simplified representation of FIG. 4 with a single write line, in which means of controlling the gradient at which the write current is set up are also described.

FIG. 5 shows a simplified representation of FIG. 4 with a single write line, and also describes means of controlling the gradient for setting up the write current, called the write current rising front, which defines the rate of setting up the write current to the required value. Thus, when a WL line is addressed in write, the associated transfer gate T is addressed by an addressing signal adr that is activated. Consequently, the grid of transistor N3 that was previously connected to the ground through the transistor N4, is suddenly activated. At this stage, since N3 is blocked, the drain voltage of N1 is zero, the grid voltage of N2 is then equal to the voltage increment imposed by the voltage follower stage and the drain voltage of N2 is close to Vdd. Activation of the transfer gate T then causes a transfer of charges due to the fact that the equivalent capacitance on the node common to all transfer gates referenced COM in FIG. 5, will discharge at the equivalent capacitance of the grid of N3. Therefore, this phenomenon will control the voltage on the grid of N3. As the capacitance at the common node COM becomes greater, the quantity of charges stored at the time that no line is addressed will be greater and the collection of charges on the grid of N3 will be greater at the time that a line is selected in write. Therefore, the voltage on the grid of N3 will increase correspondingly more quickly.

Therefore the equivalent capacitance present at the common node COM provides a means of managing the gradient at which the write current is set up. According to one particular embodiment of the invention, this equivalent capacitance can be varied when no line is addressed in write, thus improving control over the gradient at which the write current is set up, by connecting at least one capacitor Cslewrate at the common node through a transfer gate T', with two states that depend on a logical selection signal that can be one or two values adjust and adjustb. When the gate T' connected to the capacitor Cslewrate is addressed by the adjust signal made active, the equivalent capacitance present on the common node increases. This will then charge during the interval in which no line is selected in write and at the time that the WL line is addressed in write, the grid voltage of N3 will vary more quickly, consequently enabling the write current to be set up more quickly.

The rising front of the write current is therefore modified by the addition of the capacitor Cslewrate. As the capacitance increases, the rising front will be faster. It is possible to provide several capacitances of this type each associated with a transfer gate T', so as to control the rising front of the write current using signals for activating the transfer gates T'. The falling front of the write current is controlled by transistor N4. A slow front (small W/L) or a fast front (large W/L) can be obtained by modifying its ratio W/L.

An MRAM memory organized as a matrix of n write bit lines and m write word lines comprises a device for setting up a write current as has been described above for all of the n write bit lines and for all of the m write word lines respectively.

It should be noted that the invention is not limited to the example embodiment described with reference to FIGS. 2 to 5, and particularly other variant embodiments such as the auto-dual scheme are possible that might depend on the manufacturing technology considered. Thus, in one variant within the scope of the invention, it could be considered that the metallic write lines are connected to the ground and that the MOS transistors referenced N1 and N3 in the Figures, designed to fix the write current at each write line, are chosen to be of the P type. In this variant, except for transfer gates, N type MOS transistors are replaced by P type MOS transistors and vice versa, in the Figures mentioned above. The corresponding ground and power supply connections at the transistors are then also inverted.

Having thus described at least one illustrative embodiment of the invention, various alterations, modifications, and improvements will readily occur to those skilled in the art. Such alterations, modifications, and improvements are intended to be within and scope of the invention. Accordingly, the foregoing description is by way of example only and is not intended as limiting. The invention is limited only as defined in the following claims and the equivalents thereto.

What is claimed is:

1. Device for setting up a write current to a plurality of write lines in an MRAM type integrated circuit memory, the device comprising:
   a current mirror comprising:
      a first stage including a reference regulated cascode stage receiving all or part of the write current on an input of the first stage; and
      a second stage including a copy regulated cascode stage copying the write current to the plurality of write lines,
      wherein the copy regulated cascode stage comprises a plurality of addressing MOS transistors for controlling the addressing of the plurality of write lines,
      wherein each addressing MOS transistor of the plurality of addressing MOS transistors is connected to a common MOS transistor of the copy regulated cascode stage, a grid of which is connected to an output of the reference regulated cascode stage, said common MOS transistor being designed to fix the value of the write current.

2. Device for setting up a write current to a plurality of write lines in an MRAM type integrated circuit memory, the device comprising:
   a current mirror comprising:
      a first stage including a reference regulated cascode stage receiving all or part of the write current on an input of the first stage; and
      a second stage including a copy regulated cascode stage copying the write current to the plurality of write lines,
      wherein the copy regulated cascode stage comprises a plurality of addressing MOS transistors for controlling the addressing of the plurality of write lines,
      wherein each addressing MOS transistor of the plurality of addressing MOS transistors is connected to a common MOS transistor of the copy regulated cascode stage, a grid of which is connected to an output of the reference regulated cascode stage, said common MOS transistor being designed to fix the value of the write current, wherein the copy regulated cascode stage includes a slaving branch composed of a first MOS transistor a grid voltage of which depends on a current output by a current source of said slaving branch, the common MOS transistor fixing the write current being connected to a grid of the said first MOS transistor of the slaving branch through a voltage follower stage designed to output a voltage increment to the said grid voltage of the said first MOS transistor of the said slaving branch.

3. Device according to claim 2, wherein each addressing MOS transistor of the plurality of addressing MOS transistors is connected to a transfer gate controlling in a first state a switching off of the said addressing MOS transistor and, in a second state, a connection of the said addressing MOS transistor to the said first MOS transistor of the slaving branch of the copy regulated cascode stage, so as to allow, in the said second state, the write current fixed by the common transistor to pass through the said addressing MOS transistor.

4. Device according to claim 1, wherein the copy regulated cascode stage includes means of controlling a set up gradient of the write current.

5. Device for setting up a write current to a plurality of write lines in an MRAM type integrated circuit memory, the device comprising:

a current mirror comprising:
a first stage including a reference regulated cascode stage receiving all or part of the write current on an input of the first stage; and
a second stage including a copy regulated cascode stage copying the write current to the plurality of write lines,
wherein the copy regulated cascode stage includes means of controlling a set up gradient of the write current,
wherein the means of controlling the set up gradient of the write current include at least one capacitor, designed to make vary an equivalent capacitance at a common node to a plurality of addressing MOS transistors of the copy regulated cascode stage for controlling the addressing of the plurality of write lines.

6. Device according to claim 2 wherein the current source of the copy regulated cascode stage slaving branch includes a second MOS transistor of the slaving branch.

7. Device according to claim 6, wherein the first and second MOS transistors of the slaving branch operate under saturation conditions.

8. Device according to claim 2, wherein the voltage follower stage comprises a first PMOS transistor, a source of which is connected to a power supply voltage, a grid is connected to a polarization voltage and a drain is connected to a source of a second PMOS transistor of the said voltage follower stage, a drain of which is connected to a ground, the said source of the said second PMOS transistor of the said voltage follower stage being connected to the grid of the first MOS transistor of the slaving branch and a grid of the said second PMOS transistor of the said voltage follower stage being connected to a drain of the common MOS transistor designed to fix the value of the write current, the said second PMOS transistor of the said voltage follower stage being designed to apply a voltage received on its grid to its source, adding the voltage increment to it.

9. Device for setting up a write current to a plurality of write lines in an MRAM type integrated circuit memory, the device comprising:

a current mirror comprising:
a first stage including a reference regulated cascode stage receiving all or part of the write current on an input of the first stage; and
a second stage including a copy regulated cascode stage copying the write current to the plurality of write lines,
wherein the copy regulated cascode stage comprises a plurality of addressing MOS transistors for controlling the addressing of the plurality of write lines,
wherein each addressing MOS transistor of the plurality of addressing MOS transistors is connected to a common MOS transistor of the copy regulated cascode stage, a grid of which is connected to an output of the reference regulated cascode stage, said common MOS transistor being designed to fix the value of the write current,
wherein the reference regulated cascode stage includes a receiving MOS transistor in an input stage receiving all or part of the write current and a slaving branch composed of a first MOS transistor a grid voltage of which depends on a current output by a current source of the slaving branch, a receiving MOS transistor fixing the current being connected to a grid of the first MOS transistor of the slaving branch through a voltage follower stage designed to output a voltage increment to the grid voltage of the first MOS transistor of the slaving branch.

10. Device according to claim 9 wherein the current source of the reference regulated cascode stage slaving branch includes a second MOS transistor of the slaving branch.

11. Device according to claim 9, wherein the first and second MOS transistors of the slaving branch operate under saturation conditions.

12. Device according to claim 9, wherein the plurality of write lines of the MRAM type integrated circuit memory comprises a matrix of a plurality of write bit lines and a plurality of write word lines, and wherein the MRAM type integrated circuit memory comprises a first and second device for setting up the write current respectively to the plurality of write bit lines and to the plurality of write word lines, wherein each of the first and second devices for setting up the write current comprises the current mirror.

* * * * *

UNITED STATES PATENT AND TRADEMARK OFFICE
CERTIFICATE OF CORRECTION

PATENT NO. : 7,545,686 B2  
APPLICATION NO. : 11/083112  
DATED : June 9, 2009  
INVENTOR(S) : Jean Lasseuguette et al.

Page 1 of 1

It is certified that error appears in the above-identified patent and that said Letters Patent is hereby corrected as shown below:

On the title page, item (74) should read:
(74) Attorney, Agent, or Firm – Lisa K. Jorgenson; James H. Morris; Wolf, Greenfield & Sacks, P.C.

Col 2, line 33 should read:
lines WL0 and WL1 is connected to the drain of an NMOS line 38
to a control signal Rdec1 output by the address decoder and its Col 5, line 48 should read:
N2 also depends on its size W/L.

Signed and Sealed this

Eleventh Day of August, 2009

David J. Kappos
*Director of the United States Patent and Trademark Office*